(12) United States Patent
Jeon et al.

(10) Patent No.: US 6,961,271 B2
(45) Date of Patent: Nov. 1, 2005

(54) MEMORY DEVICE IN WHICH MEMORY CELLS HAVING COMPLEMENTARY DATA ARE ARRANGED

(75) Inventors: Byung-Gil Jeon, Gyeonggi-do (KR); Ki-Nam Kim, Gyeonggi-do (KR); Mun-Kyu Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/620,022

(22) Filed: Jul. 14, 2003

(65) Prior Publication Data

US 2004/0047197 A1 Mar. 11, 2004

(30) Foreign Application Priority Data

Sep. 9, 2002 (KR) .................. 10-2002-0054169

(51) Int. Cl.$^7$ ................................ G11C 7/00
(52) U.S. Cl. .................. 365/190; 365/63; 365/205
(58) Field of Search ................ 365/190, 205, 365/63

(56) References Cited

U.S. PATENT DOCUMENTS

| | | | | |
|---|---|---|---|---|
| 6,125,071 A | * | 9/2000 | Kohno et al. | 365/230.03 |
| 6,344,990 B1 | * | 2/2002 | Matsumiya et al. | 365/190 |
| 6,608,772 B2 | * | 8/2003 | Ooishi | 365/63 |

* cited by examiner

Primary Examiner—Huan Hoang
(74) Attorney, Agent, or Firm—Marger Johnson & McCollom, P.C.

(57) ABSTRACT

A memory cell array block has unit memory cells comprised of pairs of memory cells, each of have a memory cell and a complementary memory cell. A second unit memory cell is interleaved with the first unit memory cell, a fourth unit memory cell is interleaved with a third unit memory cell. First and second sense amplifiers are disposed over and under the array block, respectively. The first switch connects bitlines coupled to the first unit memory cell with the first sense amplifier and connects bitlines coupled to the second unit memory cell with the second sense amplifier. The second switch connects bitlines coupled to the third unit memory cell with the first sense amplifier and connects bitlines coupled to the fourth unit memory cell with the second sense amplifier. A selected unit memory cell is selectively connected with a sense amplifier, decreasing the number of sense amplifiers.

3 Claims, 4 Drawing Sheets

MEMORY DEVICE IN WHICH MEMORY CELLS HAVING COMPLEMENTARY DATA ARE ARRANGED

FIELD OF THE INVENTION

The present invention generally relates to a semiconductor memory device and, more particularly, to a memory device in which memory cells having complementary data are arranged.

BACKGROUND OF THE INVENTION

Typically, 1T-1C (one capacitor and one capacitor) type DRAMs have been used. Instead of the 1T-1C type DRAMs, 2T-2C (two transistors and two capacitors) type DRAMs may be used. The 2T-2C type DRAM has the disadvantage that its memory cell area is large, while having the advantage that, its memory cell sensing margin is almost double the memory cell sensing margin of the IT-1C type DRAM cell because complementary data is stored in one DRAM cell, and a reference voltage for a bitline sense amplifier is unnecessary.

A 2T-2C type DRAM unit cell is now described below with reference to FIG. 1 and FIG. 2.

Referring to FIG. 1, a conventional 2T-2C type DRAM unit cell 100 is illustrated. A first cell transistor 101 has a gate coupled to a wordline WL, a drain coupled to a bitline BL, and a source coupled to one electrode of a first cell transistor 102. The other electrode of the first cell capacitor 102 is coupled to a plate line PL. A second cell transistor 103 has a gate coupled to the wordline WL, a drain coupled to a complementary bitline BLB, and a source coupled to one electrode of a second cell capacitor 104. The other electrode of the second cell capacitor 104 is coupled to the plate line PL. The first cell transistor 101 and the fist cell capacitor 102 constitute a memory cell CELL, and the second cell transistor 103 and the second cell capacitor 104 constitute a complementary memory cell CELLB. Accordingly, data stored in the first cell capacitor 102 is complementary with data stored in the second cell capacitor 104.

Referring to FIG. 2, another conventional 2T-2C type DRAM unit cell 200 is illustrated. A first cell transistor 201 and a first cell capacitor 202 and a second cell transistor 203 and a second cell capacitor 204 are reflected with respect to a plate PL.

The DRAM cells 100 and 200 are copied or reflected in the row (or wordline) direction or the column (or bitline) direction to be disposed in a memory cell block.

Ferroelectric random access memory (FRAM) may be variously configured with memory cells. FIG. 3 and FIG. 4 illustrate 2T-2C type FRAM cells 300 and 400 which are similar to the 2T-2C type DRAM cells 100 and 200, respectively. A first ferroelectric capacitor 302 coupled to a first cell transistor 301 and a second ferroelectric capacitor 304 coupled to a second cell transistor 303 are magnetized with opposite polarity. The FRAM cell connection structures of FIG. 1 and FIG. 2 are identical with those of FIG. 3 and FIG. 4, respectively.

FIG. 5 illustrates a memory array 500 including the same unit cells as shown in FIG. 2 or FIG. 4. First to eighth memory cells MCi (i=0, 1, ..., 7) coupled to a first wordline WL0 and ninth to sixteenth memory cells MCi (i=8, 9, ..., 15) coupled to a second wordline WL1 are connected to sense amplifiers (S/A) 501, 502, 503, and 504 through bitlines BLi (i=0, 1, 2, 3) and complementary bitline BLiB (i=0, 1, 2, 3). First and third bitline/complementary bitline couples BL0/BL0B and BL2/BL2B are connected to the sense amplifiers 501 and 503 over the memory cell array, respectively. Second and fourth bitline/complementary bitline couples BL1/BL1B and BL3/BL3B are connected to the sense amplifiers 502 and 504 disposed under the memory cell array, respectively.

As the memory capacity increase, arranged memory cells as well as sense amplifiers increase in number. Thus a layout area occupied by the sense amplifies increases and the sense amplifiers are densely populated, which makes it difficult to perform an integration process. In addition, power consumption increases along with increase in number of the arranged sense amplifiers because they operate at the same time. Accordingly, there is a demand for a memory device having a memory block arrangement which can reduce chip size and power consumption.

SUMMARY OF THE INVENTION

In accordance with an embodiment of the invention, a memory device includes a memory cell array block, a first sense amplifier, a second sense amplifier, a first switch, and a second switch. A memory cell array block has pairs of memory cells each of which are composed of a memory cell and a complementary memory cell and are disposed at intersections of rows and columns. In the memory cell array block, first and second memory cells and first and second complementary memory cells are connected to a first wordline arranged in the row direction, third and fourth memory cells and third and fourth complementary memory cells are connected to a second wordline, the first and third memory cells are adjacently disposed between the first and second wordlines, the second and fourth memory cells are adjacently disposed therebetween, the first and second complementary memory cells are adjacently disposed therebetween, and the third and fourth complementary memory cells are adjacently disposed therebetween. The first sense amplifier is disposed over the memory cell array block, and the second sense amplifier is disposed under the memory cell array block. The first switch connects bitlines coupled to the first memory cell and the first complementary memory cell with the first sense amplifier and connects bitlines coupled to the second memory cell and the second complementary memory cell with the second sense amplifier. The second switch connects bitlines coupled to the third memory cell and the third complementary memory cell with the first sense amplifier and connects bitlines coupled to the fourth memory cell and the fourth complementary memory cell with the second sense amplifier.

Preferably, the pair of the memory cells are further arranged such that the first and second memory cells and the first and second complementary memory cells are interleaved and the third and fourth memory cells and the third and fourth complementary memory cells are interleaved.

DESCRIPTION OF THE PREFERRED EMBODIMENT

Figure 1:
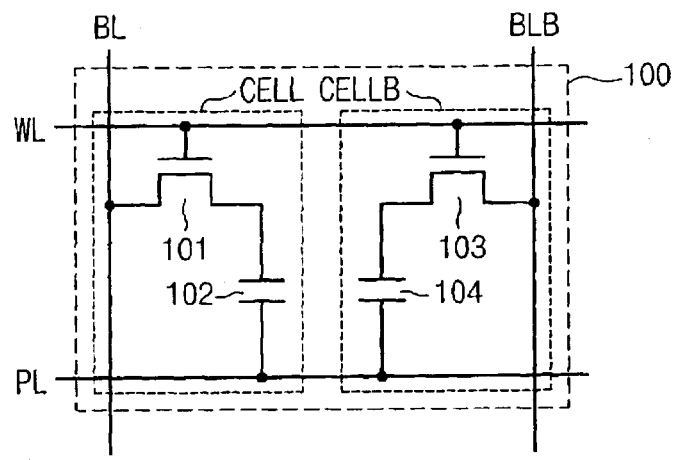
FIG. 1 shows a conventional 2T-2C type DRAM cell.
Figure 2:
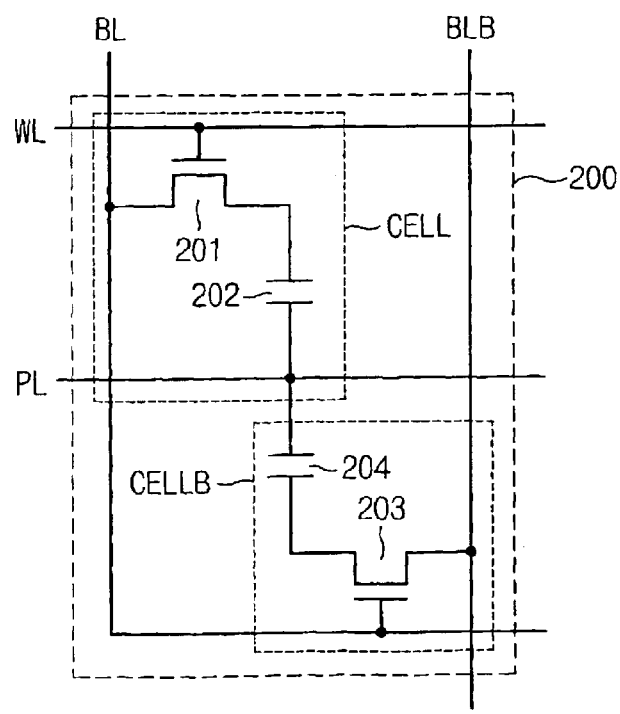
FIG. 2 shows another conventional 2T-2C type DRAM cell.
Figure 3:
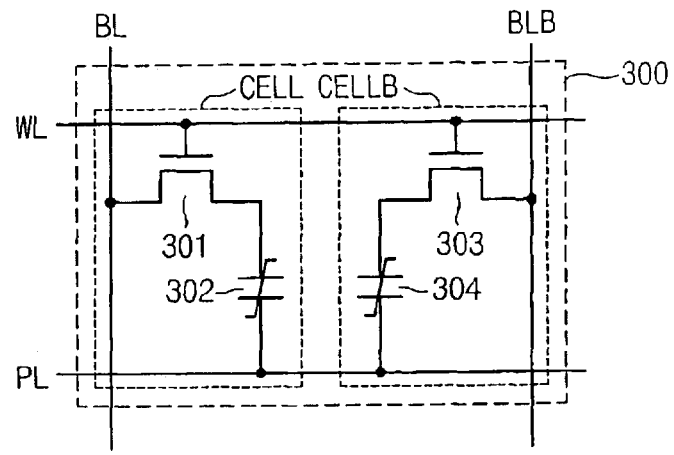
FIG. 3 shows a conventional 2T-2C type FRAM cell.
Figure 4:
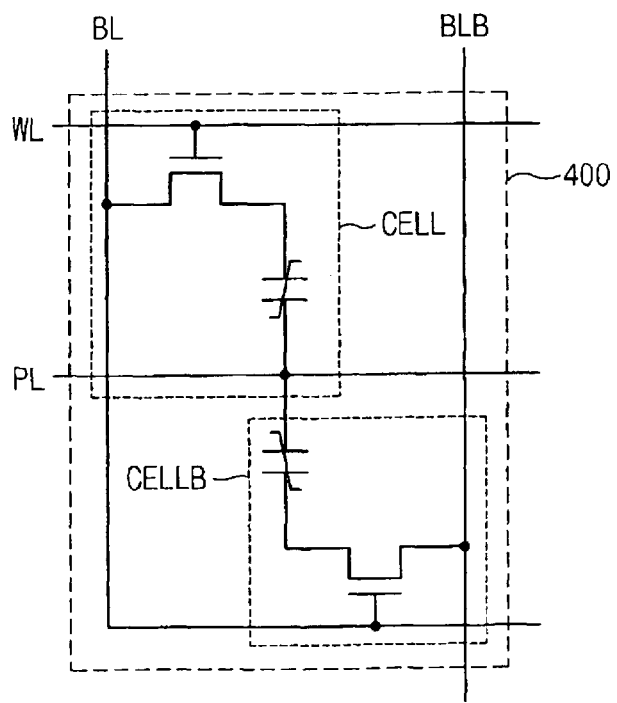
FIG. 4 shows another conventional 2T-2C type FRAM cell.
Figure 6:
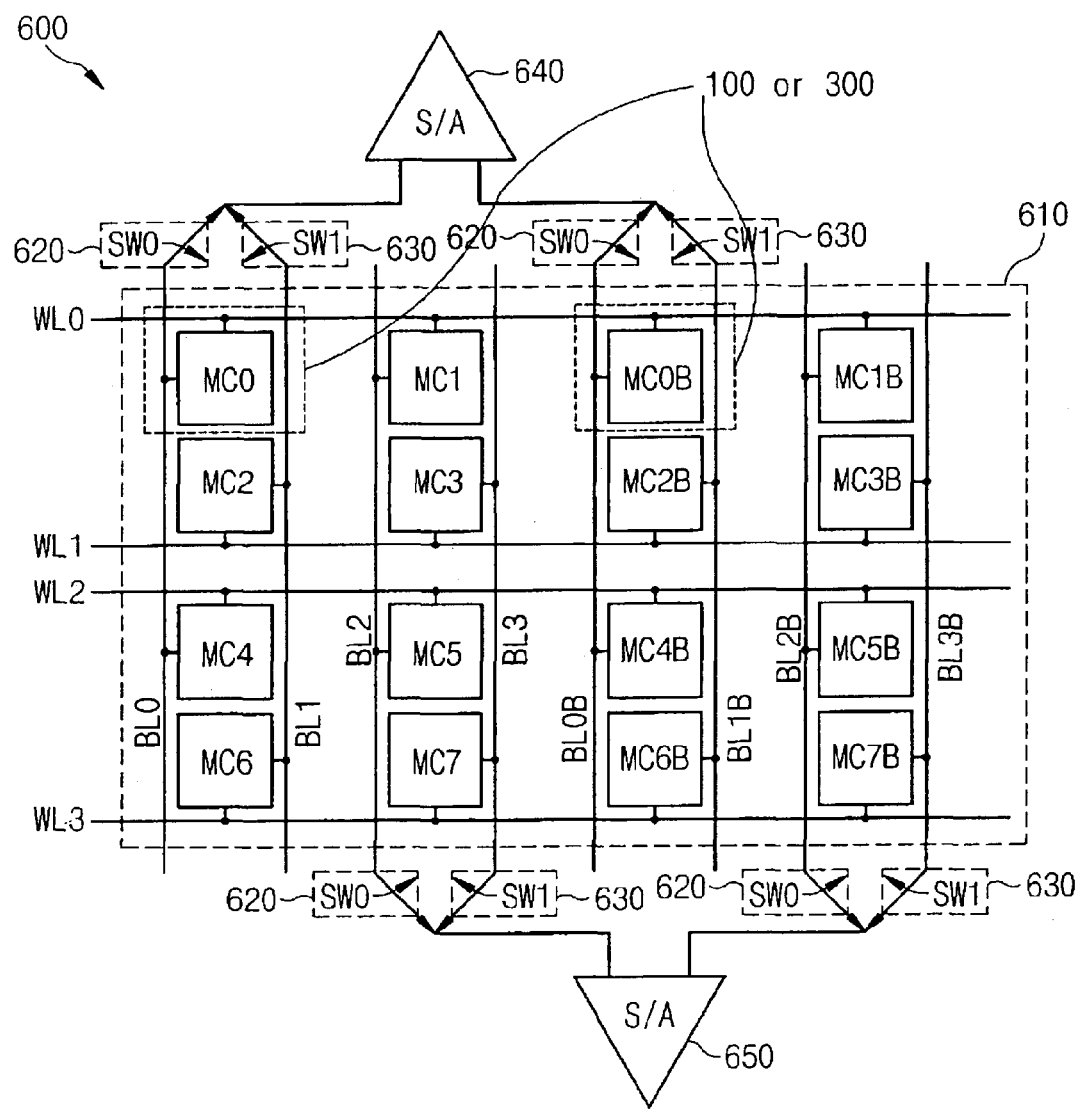
FIG. 6 shows a memory device having a memory cell arrangement according to the present invention.

Referring to FIG. 6, a memory device 600 includes a memory cell array block 610, a first switch 620, a second switch 630, a first sense amplifier (S/A) 640, and a second sense amplifier (S/A) 650. In the memory cell array block 610, a plurality of memory cells MC and a plurality of complementary memory cells MCB are disposed at intersections of rows and columns. First to fourth wordlines WL0, WL1, WL2, and WL3 are disposed in the row direction, and first to fourth bitlines BLi (i=0, 1, 2, 3) and first to fourth complementary bitlines BLiB (i=0, 1, 2, 3) are disposed in the column direction. The memory cells MC and the complementary memory cells MCB coupled to the first and second wordlines WL0 and WL1 operates the same as the memory cells MC and the complementary memory cells MCB coupled to the third and fourth wordlines WL2 and WL3. Therefore, only the memory cells MC and the complementary memory cells MCB coupled to the first and second wordlines WL0 and WL1 will be representatively explained in detail. Of the memory cells MC and the complementary memory cells MCB, for example, memory cells MC0 and MC0B constitute one unit memory cell (100 of FIG. 1 or 300 of FIG. 3).

The first and second memory cells and complementary memory cells MC0, MC1, MC0B, and MC1B are coupled to the first wordline WL0. The third and fourth memory cells and complementary memory cells MC2, MC3, MC2B, and MC3B are coupled to the second wordline WL1. The first memory cell MC0 and the third memory cell MC2, the second memory cell MC1 and the fourth memory cell MC3, the first complementary memory cell MC0B and the third complementary memory cell MC2B, and the second complementary memory cell MC1B and the fourth complementary memory cell MC3B are adjacently disposed between the first wordline WL0 and the second wordline WL1, respectively. The first memory cell MC0 is coupled to the first bitline BL0, and the third memory cell MC2 is coupled to the second bitline BL1. The second memory cell MC1 is coupled to the third bitline BL2, and the fourth memory cell MC3 is coupled to the fourth bitline BL3. The first complementary memory cell MC0B is coupled to the first complementary bitline BL0B, and the third complementary memory cell MC2B is coupled to the second complementary bitline BL1B. The second complementary memory cell MC1B is coupled to the third complementary bitline BL2B, and the fourth complementary memory cell MC3B is coupled to the fourth complementary bitline BL3B.

The first sense amplifier 640 is disposed over the memory cell array block 610. The first sense amplifier 640 is connected to the first bitline BL0 and the first complementary bitline BL0B through the first switch 620 and is coupled to the second bitline BL1 and the second complementary bitline BL1B through the second switch 630. The second sense amplifier 650 is disposed under the memory cell array block 610. The second sense amplifier 650 is connected to the third bitline BL2 and the third complementary bitline BL2B through the first switch 620 and is connected to the fourth bitline BL3 and the fourth complementary bitline BL3B through the second switch 630. When the first switch 620 is switched on, the first bitline BL0 and the first complementary bitline BL0B are connected to the first sense amplifier 640 and the third bitline BL2 and the third complementary bitline BL2B are connected to the second amplifier 650. When the second switch 630 is switched on, the second bitline BL1 and the second complementary bitline BL1B are connected to the first sense amplifier 640 and the fourth bitline BL3 and the fourth complementary bitline BL3B are connected to the second sense amplifier 650.

Figure 5:
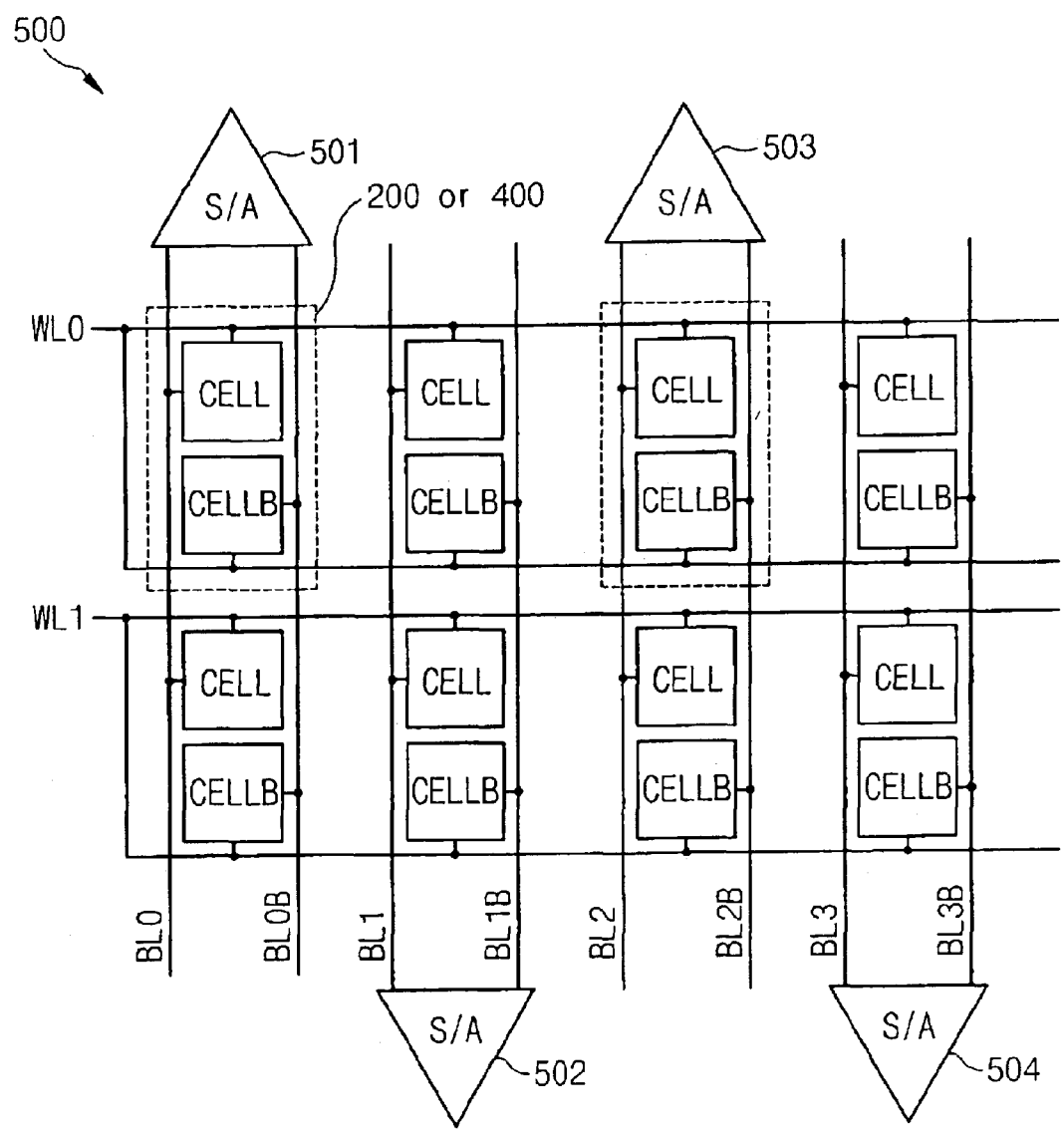
FIG. 5 shows a conventional memory block having the same memory cells as shown in FIG. 2 or FIG. 4.

The reading operation of the memory device 600 is now explained in detail. When the first wordline WL0 is enabled and the first switch 620 is switched on, data of the first memory cell MC0 and data of the first complementary memory cell MC0B are transmitted to the first sense amplifier 640 to be sensed and amplified, and data of the second memory cell MC1 and data of the second complementary memory cell MC1B are transmitted to the second sense amplifier 650 to be sensed and amplified. At this time, since the second switch is switched off, the second bitline BL1 and the second complementary bitline BL1B are not connected to the first sense amplifier 640 to be set to a ground voltage (VSS) level, and third bitline BL2 and the third complementary bitline BL2B are not connected to the second sense amplifier 650 to be set to the ground voltage (VSS) level. A pair of a memory cells CELL and a complementary memory cell CELLB, may comprise one unit memory cell. The one unit memory cell is selectively connected to the sense amplifiers 640 and 650 through the pair of the memory cell CELL and the complementary memory cell CELLB. Thus, in arranging the same number of memory cells, the number of the sense amplifiers 640 and 650 corresponds to a half of the number of the sense amplifiers 501, 502, 503, and 504 arranged in the conventional memory device 500 shown in FIG. 5. Accordingly, the pattern density is decreased to easily perform a layout and an integration process. Further, the number of sense amplifiers operating at the same time decreases by half to reduce the power consumption.

The first and second memory cells are interleaved with the first and second complementary memory cells as shown in FIG. 6. In that example, moving from BL0 towards BL3 one encounters first memory cell, then the second memory cell, then the first complementary memory cell and the second complementary cell. In this fashion, the first pair of memory cells, or the first unit memory cell, is interleaved with the second pair of memory cells, or the second unit memory cell. A similar arrangement occurs for the third and fourth unit memory cells.

While the present invention has been described with respect to the particular embodiments, it will be apparent to a person skilled in the art that various modifications and substitutions may be made without departing from the scope of the invention as defined in the following claims.

What is claimed is:

1. A memory device comprising:
    a memory cell array block comprising pairs of memory cells, each being composed of a memory cell and a complementary memory cell and disposed at intersections of rows and columns, in which first and second memory cells and first and second complementary memory cells are connected to a first wordline arranged in the row direction, third and fourth memory cells and third and fourth complementary memory cells are connected to a second wordline, the first and third memory cells are adjacently disposed between the first and second wordlines, the second and fourth memory cells are adjacently disposed therebetween, the first and third complementary memory cells are adjacently disposed therebetween, and the second and fourth complementary memory cells are adjacently disposed therebetween;
    a first sense amplifier disposed over the memory cell array block;
    a second sense amplifier disposed under the memory cell array block;

a first switch for connecting bitlines coupled to the first memory cell and the first complementary memory cell with the first sense amplifier and connecting bitlines coupled to the second memory cell and the second complementary memory cell with the second sense amplifier; and a second switch for connecting bitlines coupled to the third memory cell and the third complementary memory cell with the first sense amplifier and connecting bitlines coupled to the fourth memory cell and the fourth complementary memory cell with the second sense amplifier.

2. The memory device of claim 1, characterized in that the pairs of the memory cells are further arranged such that the first and second memory cells and the first and second complementary memory cells are interleaved and the third and fourth memory cells and the third and fourth complementary memory cells are also interleaved.

3. The memory device of claim 1, characterized in that when the first wordline is enabled to connect the first memory cell and the first complementary memory cell with the first sense amplifier and connect the second memory cell and the second complementary memory cell with the second sense amplifier, the third and fourth memory cells and third and fourth complementary memory cells, which are coupled to the second wordline, are set to a ground voltage level.

* * * * *